United States Patent
Hamada et al.

(10) Patent No.: US 7,786,022 B2
(45) Date of Patent: Aug. 31, 2010

(54) METHOD FOR FORMING INSULATING FILM WITH LOW DIELECTRIC CONSTANT

(75) Inventors: Yoshitaka Hamada, Joetsu (JP); Fujio Yagihashi, Joetsu (JP); Takeshi Asano, Joetsu (JP); Hideo Nakagawa, Shiga (JP); Masaru Sasago, Osaka (JP)

(73) Assignees: Shin-Etsu Chemical Co., Ltd., Tokyo (JP); Matsushita Electric Industrial Co., Ltd., Osaka (JP)

( * ) Notice: Subject to any disclaimer, the term of this patent is extended or adjusted under 35 U.S.C. 154(b) by 298 days.

(21) Appl. No.: 12/029,569

(22) Filed: Feb. 12, 2008

(65) Prior Publication Data
US 2008/0290521 A1    Nov. 27, 2008

(30) Foreign Application Priority Data
Feb. 16, 2007   (JP) ............... 2007-036345

(51) Int. Cl.
*H01L 21/31* (2006.01)
(52) U.S. Cl. ............... 438/781; 438/758; 438/783; 257/632; 257/642; 257/758; 257/759
(58) Field of Classification Search ............ 516/81, 516/82, 83, 87
See application file for complete search history.

(56) References Cited

U.S. PATENT DOCUMENTS

| | | | |
|---|---|---|---|
| 5,844,060 A | 12/1998 | Furuya et al. | |
| 6,261,357 B1 | 7/2001 | Egami et al. | |
| 6,410,150 B1 | 6/2002 | Kurosawa et al. | |
| 2002/0020327 A1 | 2/2002 | Hayashi et al. | |
| 2002/0060364 A1 | 5/2002 | Yan et al. | |
| 2004/0105986 A1* | 6/2004 | Ogihara et al. ............ 428/447 |
| 2005/0165197 A1 | 7/2005 | Ogihara et al. | |
| 2006/0009575 A1 | 1/2006 | Nakashima | |
| 2006/0084277 A1 | 4/2006 | Nakashima et al. | |
| 2007/0108593 A1 | 5/2007 | Ogihara et al. | |

FOREIGN PATENT DOCUMENTS

| | | |
|---|---|---|
| JP | 09-071654 | 3/1997 |
| JP | 09-315812 | 12/1997 |
| JP | 2001-164186 | 6/2001 |
| JP | 2001-354904 | 12/2001 |

(Continued)

OTHER PUBLICATIONS

Agaskar et al. "The higher hydridospherosiloxanes: synthesis and structures of $H_nSi_nO_{1.5n}$ (n=12, 14, 16, 18)" *Inorganica Chimica Acta* 229:355-364 (1995).

(Continued)

*Primary Examiner*—N Drew Richards
*Assistant Examiner*—Kyoung Lee

(57) ABSTRACT

In the invention, a silica sol prepared by hydrolyzing and condensing a silane compound represented by the following formula: $Si(OR^1)_4$ or $R^2{}_nSi(OR^3)_{4-n}$ wherein $R^1$s, $R^2$(s) and $R^3$(s) may be the same or different when a plurality of them are contained in the molecule and each independently represents a linear or branched $C_{1-4}$ alkyl group in the presence of a hydrophilic basic catalyst and a hydrophobic basic catalyst is used for a conventional porous-film forming composition.

6 Claims, 3 Drawing Sheets

FOREIGN PATENT DOCUMENTS

| | | |
|---|---|---|
| JP | 2004-149714 | 5/2004 |
| JP | 2004-153147 | 5/2004 |
| JP | 2004-161535 | 6/2004 |
| JP | 2004-165402 | 6/2004 |
| JP | 2004-292642 | 10/2004 |
| JP | 2005-216895 | 8/2005 |

OTHER PUBLICATIONS

Moran et al. "Ferrocenyl Substituted Octakis(dimethylsiloxy)octasilsequioxanes: A New Class of Supramolecular Organometallic Compounds. Synthesis, Characterization, and Electrochemistry", *Organometallics* 12:4327-4333 (1993).

Muller et al. "Silesquioxane Chemistry III. Carbosilane Dendrimers Based on a Cubic $Si_8O_{12}$ Core", *Main Group Metal Chemistry* 22(8):485-488 (1999).

Wang et al. "Pure Silica Zeolite Films as Low-K Dielectrics by Spin-On of Nanoparticle Suspensions", *Adv. Mater.* 13(19):1463-1466 (2001).

* cited by examiner

METHOD FOR FORMING INSULATING FILM WITH LOW DIELECTRIC CONSTANT

CROSS-RELATED APPLICATIONS

This application claims priority from Japanese Patent Application No. 2007-036345; filed Feb. 16, 2007, the disclosure of which is incorporated herein by reference in its entirety.

BACKGROUND OF THE INVENTION

1. Field of the Invention

The present invention relates to a silica sol capable of providing a porous film excellent in dielectric properties, adhesion, uniformity of thin film, and mechanical strength, a film forming composition, a method for forming a porous film, a porous film formed thereby, and a semiconductor device having the porous film therein.

2. Description of the Related Art

In the fabrication of semiconductor integrated circuits, as their integration degree becomes higher, an increase in interconnect delay time due to an increase in interconnect capacitance, which is a parasitic capacitance between metal interconnects, prevents their performance enhancement. The interconnect delay time is called an RC delay which is in proportion to the product of electric resistance of metal interconnects and the static capacitance between interconnects. Reduction in the resistance of metal interconnects or reduction in the capacitance between interconnects is necessary for reducing this interconnect delay time. The reduction in the resistance of an interconnect metal or the interconnect capacitance can prevent even a highly integrated semiconductor device from causing an interconnect delay, which enables miniaturization and high speed operation of the semiconductor device and moreover, minimization of the power consumption.

In order to reduce the resistance of metal interconnects, copper interconnects have recently replaced conventional aluminum interconnects.

Use of copper interconnects alone, however, has limits in accomplishing performance enhancement so that reduction in the interconnect capacitance is an urgent necessity for further performance enhancement of semiconductor devices.

One method for reducing interconnect capacitance may be to reduce the dielectric constant of an interlayer insulating film disposed between metal interconnects. It is the common practice to prepare a material having a dielectric constant of 2.5 or less by introducing pores therein to make it porous.

When an interlayer insulating film is made porous, however, reduction in mechanical strength and adsorption of moisture tend to deteriorate the film so that reduction in dielectric constant (k) by introduction of pores in the film and maintenance of sufficient mechanical strength and hydrophobicity are big challenges to be solved.

For satisfying both introduction of pores and sufficient mechanical strength, proposed is a method of introducing zeolite or zeolite-like structure, as ultimately hard particles, into a film to raise its strength or forming crystals to reduce remaining silanol groups, thereby maintaining sufficient hydrophobicity. For example, California University/USA has proposed a method for forming a zeolite film (silica zeolite film having an MFI crystal structure) on a semiconductor substrate by using a suspension obtained by separating and removing particles of a relatively large particle size from zeolite fine particles obtained by hydrolysis, in the presence of tetrapropylammonium hydroxide (TPAOH), of tetraethylorthosilicate (TEOS) dissolved in ethyl alcohol (refer to, for example, US Patent Application Publication No. 2002/0060364 A1, Advanced Material, 13, No. 19, 1453-1466 (2001)). Although the zeolite film obtained by the above-described method has a Young's modulus of from 16 to 18 GPa, it cannot be suited for practical use because due to high hygroscopicity of the film, it absorbs atmospheric moisture and drastically raises its dielectric constant (for example, it increases from 2.3 to 3.9). There is therefore proposed a method of keeping a dielectric constant of the film to from 2.1 to 2.3 by silane treatment for making the film surface hydrophobic.

There is also proposed a method for heightening the strength by using zeolite particles/zeolite-like particles and an alkoxysilane hydrolysate in combination (refer to, for example, Japanese Patent Provisional Publication No. 2004-153147). In this method, zeolite particles or zeolite-like particles are formed first and they are mixed with the alkoxysilane hydrolysate, optionally followed by a ripening reaction. The method for forming crystalline zeolite thus requires such a complex operation.

A synthesis method of zeolite having a low impurity content and suitable for use in semiconductor devices as described above is very cumbersome. There are many attempts to obtain a low-dielectric-constant film by using a silicon oxide-based polymer which is advantageous to an industrial process application compared to zeolite. For example, in Japanese Patent Provisional Publication No. 2004-149714, recommended is a method for improving a pore density of a film by using a large amount of tetrapropylammonium hydroxide acting as a structure directing agent upon synthesis of zeolite to partially form a zeolite-like structure, thereby forming zeolite-like micropores in the film during film formation.

The film strength itself not only depends on the physical properties of a material used for a film forming composition but also depends on the behaviors of the material during film formation. According to the report (for example, Japanese Patent Provisional Publication No. 2005-216895) by the present inventors, a high strength film can be formed by the steps of: modifying a surface of a silica sol or zeolite particles with a crosslinking group having a high crosslinkability between particles or between a particle and a silicon-oxide-based resin to be added simultaneously; temporarily losing the crosslinkability with a protective means for preventing the crosslink formation or deactivation of the crosslinking groups during stable storage; and sintering after application for removing the protective means and developing the high crosslinkability again.

SUMMARY OF THE INVENTION

A silica sot can be prepared far easier than zeolite so that it is a preferable material for industrial uses. The conventional silica sol particles cannot have enough pore density and it is not suitable for a material for maintaining pores therein. The film made of the conventional silica sol particles may have much inferior mechanical strength to that of zeolite particles. If a silica sol having high strength can be prepared, not only such a silica sot is industrially advantageous but also the particles may hold pore spaces therearound during the sintering process. Preparation of a low-dielectric-constant film having a high porosity in spite of having high strength can therefore be expected.

An object of the invention is therefore to provide a silica sot suitable for industrial use and capable of providing a porous film excellent in mechanical strength, a film forming composition containing the silica sol, a method for forming a porous film, and a porous film formed thereby.

Another object of the present invention is to provide a high-performance and high-reliability semiconductor device having a porous film prepared using the above-described advantageous material.

The present inventors made a working hypothesis in order to improve the performance of a porous-film-forming coating solution containing a silica.

Described specifically, when pores are introduced into a film of a silica in order to reduce its dielectric constant, pore does not contribute to mechanical strength of the resulting film. Additionally, the pore-introduced film has much lower mechanical strength than a pore-free material having the same composition due to vulnerability of the surface of the pores. An improvement was made as described in Japanese Patent Provisional Publication No. 2005-216895 based on a concept that silica particles are added as a structure as in the case of zeolite particles. If the mechanical strength of silica particles can be improved further, a film having high strength as formed using zeolite may be available.

Based on the above-described working hypothesis, the present inventors have carried out an extensive investigation. As a result, they succeed in increasing the mechanical strength of a porous film by using a silica sol prepared under the following specified conditions for a conventionally-used composition for forming a porous film containing silicon as a main component, thereby imparting, to the porous film, mechanical strength resulting from an increase in the strength of the silica sol. Moreover, they have accomplished a preparation method of an additive capable of improving the physical properties of the film even to a level applicable to a semiconductor fabrication process, and completed the invention.

Silica sol is a generic name of noncrystalline silicic acid polymers. Silica sols in various forms or having various properties are known and they are different each other depending on the reaction degree of a hydrolyzable silane compound and water. A silica sol having a lower condensation degree has higher hydrophilicity and lower strength, while a silica sol having a higher condensation degree has higher hydrophobicity and higher strength. As a result of an extensive investigation on a method for maximizing the condensation degree of a silica sol, the present inventors have succeeded in obtaining a porous film having a high mechanical strength, which strength may result from an increase in the strength of a silica sol, by adding a silica sol prepared under the following specified conditions to a porous-film forming composition. It has also been found that the dielectric constant of the porous film thus obtained is sufficient for application to semiconductor fabrication, leading to the completion of the invention.

In one aspect of the present invention, there is thus provided a method for preparing a silica sol, which comprises hydrolyzing and condensing a hydrolyzable silane compound in the presence of at least one hydrophilic basic catalyst selected from alkali metal hydroxides and quaternary ammonium hydroxides represented by the following formula (1):

$$(R^1)_4N^+OH^- \quad (1)$$

(wherein, $R^1$s may be the same or different and independently represent a hydrocarbon group which may contain an oxygen atom and the cationic portion $[(R^1)_4N^+]$ satisfies the following relationship (2):

(2)

in which, N, O and C are the numbers of nitrogen, oxygen and carbon atoms contained in the cationic portion, respectively) and at least one hydrophobic basic catalyst selected from quaternary ammonium hydroxides which do not satisfy the above-described relationship (2). By using both a basic catalyst having high hydrophilicity and a hydrophobic basic catalyst during preparation of a silica sol, a silica sol capable of imparting high strength to a film can be prepared.

The hydrophilic basic catalyst is selected preferably from lithium hydroxide, sodium hydroxide, potassium hydroxide, cesium hydroxide, tetramethylammonium hydroxide and choline.

The hydrophobic basic catalyst is selected preferably from quaternary organic ammonium hydroxides represented by the following formula (3):

$$(R^2)_4N^+OH^- \quad (3)$$

(wherein, $R^2$s may be the same or different and each independently represents a linear or branched $C_{1-8}$ alkyl group with the proviso that all the $R^2$s do not represent a methyl group simultaneously).

The hydrolyzable silane compound contains preferably at least one silane compound selected from those represented by the following formulas (4) and (5):

(4)

(5)

(wherein, $R^3$s may be the same or different and each independently represents a linear or branched $C_{1-4}$ alkyl group. $R^4$(s) may be the same or different when there are plural $R^4$s and each independently represents a linear or branched $C_{1-4}$ alkyl group which may have a substituent, $R^5$(s) may be the same or different when there are plural $R^5$s and each independently represents a linear or branched $C_{1-4}$ alkyl group, and n is an integer from 1 to 3). Use of these compounds as a silicon source facilitates obtaining a material less contaminated with a metal or halogen.

The method for preparing a silica sol according to the invention may further have, after the hydrolysis and condensation reactions, a step of temporarily losing the crosslinkability on the surface of the silica sol. Examples of the losing step include a method of adding a carboxylic acid having at least two carboxyl groups in one molecule thereof.

The silica sol prepared by the above-described method is also one aspect of the invention. A porous film having high strength as described later can be obtained by adding the silica sol of the invention for a porous-film forming composition. This effect on strength is particularly marked when the preparation method has the above-described post-step further.

In a further aspect of the invention, there is also provided a composition for forming a porous film containing a silica sol prepared by either one of the above-described preparation method. A porous film with high strength is available by using the composition containing the silica sol according to the invention.

In a further aspect of the present invention, there is also provided a porous film formed using the composition. The porous film of the invention can have higher strength than that of a porous film formed using a silica sol prepared in a conventional manner having the same dielectric constant attained by the conventional silica sol.

The porous film of the invention is available by the formation process having a step of applying the porous-film forming composition to form a thin film and a step of sintering the thin film. This formation process can be applied to the formation of an interlayer insulating film for semiconductor fabrication. In other words, an important user of the porous film of the invention is a semiconductor device having the porous film as an interlayer insulating film.

Although the silica sol of the invention is available without cumbersome operations as used for preparing zeolite fine particles, it has mechanical strength equal to that of zeolite and in addition, can provide a low-dielectric-constant insulating film having high performance.

DETAILED DESCRIPTION OF THE PREFERRED EMBODIMENT(S)

Figure 1:
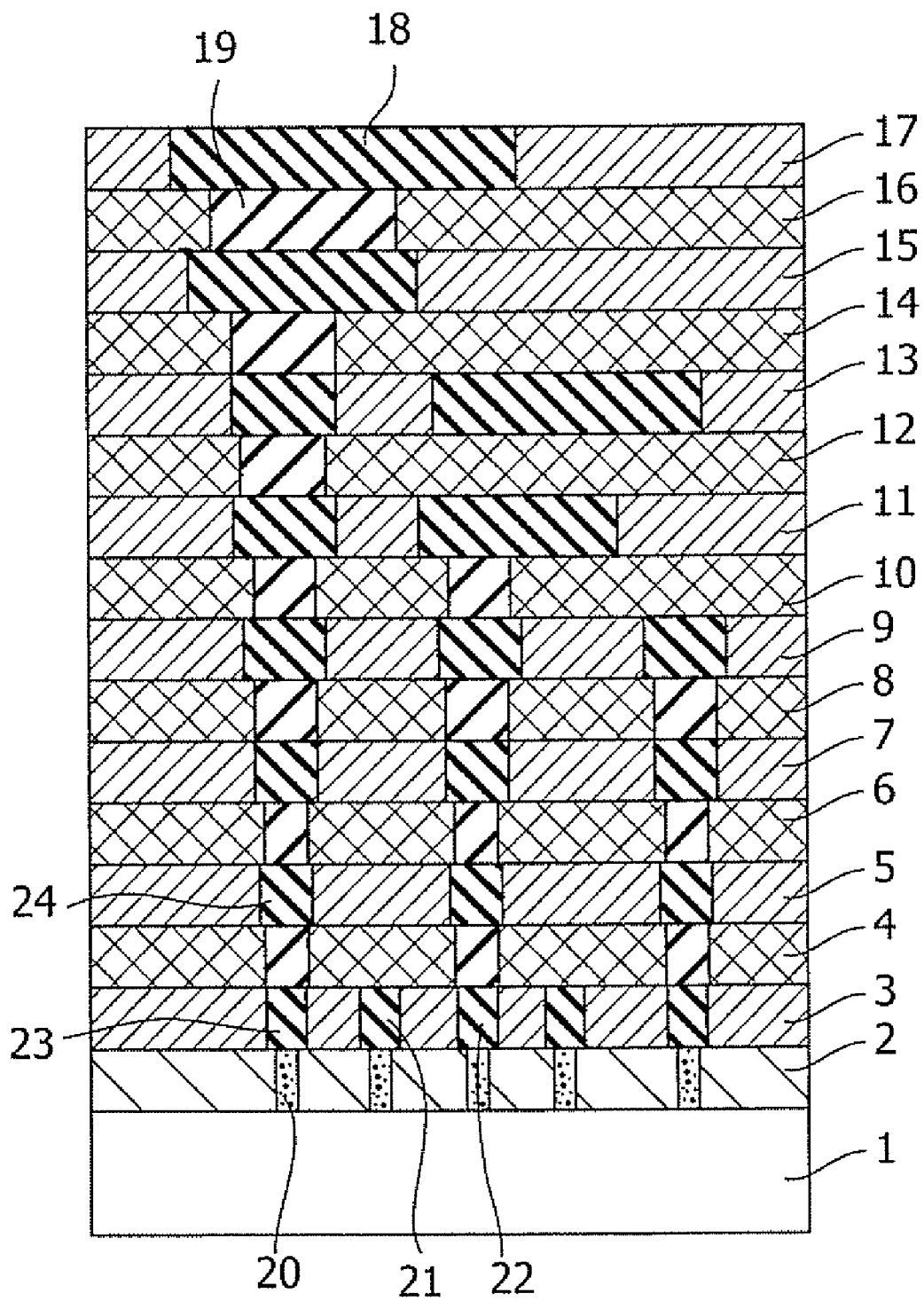
FIG. 1 is a schematic cross-sectional view illustrating one example of a semiconductor device according to the present invention.

The present invention now will be described more fully hereinafter in which embodiments of the invention are provided with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

Unless otherwise defined, all technical and scientific terms used herein have the same meaning as commonly understood by one of ordinary skill in the art to which this invention belongs.

Hereinafter, preferred embodiments of the present invention will be described. However, it is to be understood that the present invention is not limited thereto.

The synthesis method of a silica sol having high strength, which method is discovered by the present inventors, comprises hydrolyzing and condensing a hydrolyzable silane compound in the presence of at least one hydrophilic basic catalyst selected from alkali metal hydroxides and quaternary ammonium hydroxides represented by the following formula (1):

   (1)

(wherein $R^1$s may be the same or different and each independently represents a hydrocarbon group which may contain an oxygen atom and the cationic portion $[(R^1)_4N^+]$ satisfies the following relationship (2):

$(N+O)/(N+O+C) \geq 1/5$   (2)

in which N, O and C are the numbers of nitrogen, oxygen and carbon atoms contained in the cationic portion, respectively) and at least one hydrophobic basic catalyst selected from quaternary ammonium hydroxides which do not satisfy the above-described relationship (2).

$R^1$ is an organic group composed of carbon, hydrogen and oxygen and examples of such a group include $C_{1-20}$ alkyl groups which may have a hydroxyl group or may have a —O—, —(C=O)—, or —(C=O)O— structure in the alkyl group.

The hydrophilic basic catalyst is an alkali metal hydroxide or organic ammonium hydroxide having a low carbon ratio. Such a basic catalyst does not function well for forming an association state with silane having a silanol group but is active as a condensation reaction catalyst. Preferred examples of the hydrophilic basic catalyst include alkali metal hydroxides such as lithium hydroxide, sodium hydroxide, potassium hydroxide and cesium hydroxide, and quaternary ammonium salts such as tetramethylammonium hydroxide and choline. Of these, tetramethylammonium hydroxide and choline are especially preferred because use of a catalyst having a small metal impurity content enables elimination of demetallization treatment or reduction of a burden due to such demetallization treatment after preparation.

Of the organic quaternary ammonium hydroxides as the hydrophobic basic catalyst, those having a higher carbon ratio and a higher capacity of forming an association state with silane having a silanol group than the hydrophilic ones are preferred, of which those represented by the following formula (3):

   (3)

(wherein, $R^2$s may be the same or different and each independently represents a linear or branched $C_{1-8}$ alkyl group with the proviso that all the $R^2$s do not represent a methyl group simultaneously) are selected as more preferred ones. It is very important to select a proper hydrophobic base catalyst. Catalysts showing good dispersibility in an aqueous solution and having low micelle forming properties though being hydrophobic are preferred, of which those having no micelle forming properties are more preferred. Specific examples include the following ammonium salts such as:

ethyltrimethylammonium hydroxide, propyltrimethylammonium hydroxide, butyltrimethylammonium hydroxide, pentyltrimethylammonium hydroxide, hexyltrimethylammonium hydroxide, heptyltrimethylammonium hydroxide, octyltrimethylammonium hydroxide, diethyldimethylammonium hydroxide, dipropyldimethylammonium hydroxide, dibutyldimethylammonium hydroxide, dipentyldimethylammonium hydroxide, dihexyldimethylammonium hydroxide, diheptyldimethylammonium hydroxide, dioctyldimethylammonium hydroxide, triethylmethylammonium hydroxide, tripropylmethylammonium hydroxide, tributylmethylammonium hydroxide, tripentylmethylammonium hydroxide, trihexylmethylammonium hydroxide, triheptyl methylammonium hydroxide, trioctylmethylammonium hydroxide, tetraethylammonium hydroxide, propyltriethylammonium hydroxide, butyltriethylammonium hydroxide, pentyltriethylammonium hydroxide, hexyltriethylammonium hydroxide, heptyltriethylanimonium hydroxide, octyltriethylammonium hydroxide, dipropyldiethylammonium hydroxide, dibutyldiethylammonium hydroxide, dipentyldiethylammonium hydroxide, dihexyldiethylammonium hydroxide, diheptyldiethylammonium hydroxide, dioctyldiethylammonium hydroxide, tripropylethylammonium hydroxide, tributylethylammonium hydroxide, tripentylethylammonium hydroxide, trihexylethylammonium hydroxide, triheptylethylammonium hydroxide, trioctylethylammonium hydroxide, tetrapropylammonium hydroxide, butyltripropylammonium hydroxide, pentyltripropylammonium hydroxide, hexyltripropylammonium hydroxide, heptyltripropylammonium hydroxide, octyltripropylammonium hydroxide, dibutyldipropylammonium hydroxide, dipentyldipropylammonium hydroxide, dihexyldipropyl ammonium hydroxide, diheptyldipropyl ammonium hydroxide, dioctyldipropylammonium hydroxide, tributylpropylammonium hydroxide, tripentylpropylammonium hydroxide, trihexylpropylammonium hydroxide, triheptylpropylammonium hydroxide, trioctylpropylammonium hydroxide, tetrabutylammonium hydroxide, pentyltributylammonium hydroxide, hexyltributylammonium hydroxide, heptyltributylammonium hydroxide, octyltributylanunonium hydroxide, dipentyldibutylammoniun hydroxide, dihexyldibutylammonium hydroxide, diheptyldibutylammonium hydroxide, dioctyldibutylammonium hydroxide, tripentylbutylammonium hydroxide, trihexylbutylammonium hydroxide, triheptylbutylammonium hydroxide, trioctylbutylammonium hydroxide, tetrapentylammonium hydroxide, hexyltripentylammonium hydroxide, heptyltripentylammonium hydroxide, octyltripentylammonium hydroxide, dihexyldipentylammonium hydroxide, diheptyldipentylammonium hydroxide, dioctyldipentylammonium hydroxide, trihexylpentylammonium hydroxide, triheptylpentylammonium hydroxide, trioctylpentylammonium hydroxide, tetrahexylammonium hydroxide, heptyltrihexylanimonium hydroxide, octyltrihexylammonium hydroxide, diheptyldihexylammonium hydroxide, dioctyldihexylammoniurn hydroxide, triheptylhexylammonium hydroxide, trioctylhexylammonium hydroxide, tetraheptylammonium hydroxide, octyltriheptylammonium hydroxide, dioctyldiheptylammonium hydroxide, trioctylheptylammonium hydroxide and tetraoctylammonium hydroxide.

The amount of the basic catalyst, as the total amount of the hydrophobic basic catalyst and the hydrophilic basic catalyst, is from 1 to 50 mole %, preferably from 5 to 30 mole %, more preferably from 10 to 20 mole % per mole of the total amount of the hydrolyzable silane compound which will be described later. Amounts of the catalyst exceeding the above-described range may hinder the sufficient growth of silica sol particles, making it difficult to prepare a low-k film. Amounts of the catalyst below the above-described range, on the other hand, do not cause condensation of siloxane sufficiently, making it impossible to obtain a film having intended strength. With regard to a mixing ratio of the hydrophobic catalyst and the hydrophilic catalyst, it is desired to add from 0.2 to 2.0 moles of the hydrophilic basic catalyst to 1 mole of the hydrophobic basic catalyst.

As described later, a porous film obtained from a film forming composition containing the silica sol prepared in the presence of such a combination of the basic catalysts has higher strength than a film prepared by a conventional synthesis method not depending on the above-described combination.

The present inventors presume that this high mechanical strength of the film is attributable to the strength of the silica sol itself. The reason for the high strength of the silica sol of the invention obtained by the preparation method of the invention may be as follows, which does not limit the technical scope of the invention.

When the hydrophobic basic catalyst to be used in the invention is used alone as in the conventional manner, an association state may be formed with an alkoxysilane, which is also publicly known as a structure directing agent for determining the crystal type of zeolite, or silanol due to high affinity therewith (so-called hydrophobic interaction). However, the catalyst may have poor affinity with water and low reactivity with water molecules due to its hydrophobicity so that a hydrolysis reaction or a dehydration condensation reaction may occur only slowly and a sufficient condensation reaction may not proceed.

The hydrophilic basic catalyst may be highly effective for promoting a hydrolysis reaction or dehydration condensation reaction, but may not have a sufficient capacity of forming an association state with a silane source so that the condensation occurs speedily but at random and a portion having an internal strain appears. As a result, sufficient bonds may not be formed in some portions.

When the hydrophobic basic catalyst and the hydrophilic basic catalyst are used in combination, on the other hand, an association state may be formed between the hydrophobic basic catalyst and alkoxysilane by the hydrophobic interaction and such association state may be maintained by the static interaction between a silanol (silicate) and ammonium cation even after partial progress of hydrolysis of the alkoxysilane into silanol. The hydrophilic basic catalyst may then act on the association to promote the condensation reaction of the silanol. As the reaction may proceed sufficiently, a siloxane backbone having a high spatial crosslinking proportion may be formed at the associated site. The hydrophobic basic catalyst may act to form another association state between the alkoxysilane and silica surface. The hydrophilic basic catalyst then may promote the condensation. The growth of a silica sol may proceed by the repetition of such reactions. In a film obtained from the silica sol prepared by this method, no or almost no micropores may be observed, suggesting that the silica sol may not be of a type partially having a zeolite-like crystal structure. Due to the combined use with the hydrophilic basic catalyst, the growth of the silica sol may proceed according to the above-described mechanism in which a large amount of the hydrophobic basic catalyst does not remain in the silica sol. Such mechanism may enable to form amorphous silica with less internal strains and a high crosslinking ratio instead of forming a crystal such as a zeolite structure. Moreover, the silica gel whose condensation reaction may proceed while sufficiently relaxing the internal strain during condensation does not have therein many remaining silanol groups and therefore may be rigid and may have high hydrophobicity. When a low dielectric constant film is formed as described later, the film may therefore have both high strength and a stable low dielectric constant.

As the silicon source to be used for the preparation of the silica sol of the invention, silicon sources similar to those used conventionally for the preparation of a silica sol are principally usable. The preferably hydrolyzable silane compounds are represented by the following formula (4) or (5):

$$Si(OR^3)_4 \quad (4)$$

$$R^4{}_n Si(OR^5)_{4-n} \quad (5)$$

(wherein, $R^3$s may be the same or different and each independently represents a linear or branched $C_{1-4}$ alkyl group, $R^4$(s) may be the same or different when there are plural $R^4$s and each independently represents a linear or branched $C_{1-4}$ alkyl group which may have a substituent, $R^5$(s) may be the same or different when there are plural $R^5$s and each independently represents a linear or branched $C_{1-4}$ alkyl group, and n is an integer from 1 to 3).

Examples of the preferably-used silane compounds represented by the formula (4) include, but not limited to, tetramethoxysilane, tetraethoxysilane, tetrapropoxysilane, tetrabutoxysilane, tetraisopropoxysilane, tetraisobutoxysilane, triethoxymethoxysilane, tripropoxymethoxysilane, tributoxymethoxysilane, trimethoxyethoxysilane, trimethoxypropoxysilane and trimethoxybutoxysilane.

Examples of the silane compounds represented by the formula (5) include methyltrimethoxysilane, methyltriethoxysilane, methyltri-n-propoxysilane, methyltri-i-propoxysilane, methyltri-n-butoxysilane, methyltri-s-butoxysilane, methyltri-i-butoxysilane, methyltri-t-butoxysilane, ethyltrimethoxysilane, ethyltriethoxysilane, ethyltri-n-propoxysilane, ethyltri-i-propoxysilane, ethyltri-n-butoxysilane, ethyltri-s-butoxysilane, ethyltri-i-butoxysilane, ethyltri-t-butoxysilane, n-propyltrimethoxysilane, n-propyltriethoxysilane, n-propyltri-n-propoxysilane, n-propyltri-i-propoxysilane, n-propyltri-n-butoxysilane, n-propyltri-s-butoxysilane, n-propyltri-i-butoxysilane, n-propyltri-t-butoxysilane, i-propyltrimethoxysilane, i-propyltriethoxysilane, i-propyltri-n-propoxysilane, i-propyltri-i-propoxysilane, i-propyltri-n-butoxysilane, i-propyltri-s-butoxysilane, i-propyltri-i-butoxysilane, i-propyltri-t-butoxysilane, n-butyltrimethoxysilane, n-butyltriethoxysilane, n-butyltri-n-propoxysilane, n-butyltri-i-propoxysilane, n-butyltri-n-butoxysilane, n-butyltri-s-butoxysilane, n-butyltri-i-butoxysilane, n-butyltri-t-butoxysilane, i-butyltrimethoxysilane, i-butyltriethoxysilane, i-butyltri-n-propoxysilane, i-butyltri-i-propoxysilane, i-butyltri-n-butoxysilane, i-butyltri-s-butoxysilane, i-butyltri-i-butoxysilane, i-butyltri-t-butoxysilane, s-butyltrimethoxysilane, s-buyltriethoxysilane, s-butyltri-n-propoxysilane, s-butyltri-i-propoxysilane, s-butyltri-n-butoxysilane, s-butyltri-s-butoxysilane, s-butyltri-i-butoxysilane, s-butyltri-t-butoxysilane, t-butyltrimethoxysilane, t-butyltriethoxysilane, t-butyltri-n-propoxysilane, t-butyltri-i-propoxysilane, t-butyltri-n-butoxysilane, t-butyltri-s-butoxysilane, t-butyltri-i-butoxysilane, t-butyltri-t-butoxysilane, dimethyldimethoxysilane, dimethyldiethoxysilane, dimethyldi-n-propoxylsilane, dimethylidi-i-propoxysilane, dimethyldi-n-butoxysilane, dimethyldi-s-butoxysilane, dimethyldi-i-butoxysilane, dimethyldi-t-butoxysilane, diethyldimethoxysilane, diethyldiethoxysilane, diethyldi-n-propoxylsilane, diethyldi-i-propoxysilane, diethyldi-n-butoxysilane, diethyldi-s-butoxysilane, diethyldi-i-butoxysilane, diethyldi-t-butoxysilane, di-n-propyldimethoxysilane, di-n-propyldiethoxysilane, di-n-propyldi-n-propoxylsilane, di-n-propyldi-i-propoxysilane, di-n-propyldi-n-butoxysilane, di-n-propyldi-s-butoxysilane, di-n-propyldi-i-butoxysilane, di-n-propyldi-t-butoxysilane, di-i-propyldimethoxysilane, di-i-propyldiethoxysilane, di-i-propyldi-n-propoxylsilane, di-i-propyldi-i-propoxysilane, di-i-propyldi-n-butoxysilane, di-i-propyldi-s-butoxysilane, di-i-propyldi-i-butoxysilane, di-i-propyldi-t-butoxysilane, di-n-butyldimethoxysilane, di-n-butyldiethoxysilane, di-n-butyldi-n-propoxylsilane, di-n-butyldi-i-propoxysilane, di-n-butyldi-n-butoxysilane, di-n-butyldi-s-butoxysilane, di-n-butyldi-i-butoxysilane, di-n-butyldi-t-butoxysilane, di-i-butyldimethoxysilane, di-i-butyldiethoxysilane, di-i-butyldi-n-propoxylsilane, di-i-butyldi-i-propoxysilane, di-i-butyldi-n-butoxysilane, di-i-butyldi-s-butoxysilane, di-i-butyldi-i-butoxysilane, di-i-butyldi-t-butoxysilane, di-s-butyldimethoxysilane, di-s-butyldiethoxysilane, di-s-butyldi-n-propoxylsilane, di-s-butyldi-i-propoxysilane, di-s-butyldi-n-butoxysilane, di-s-butyldi-s-butoxysilane, di-s-butyldi-i-butoxysilane, di-s-butyldi-t-butoxysilane, di-t-butyldimethoxysilane, di-t-butyldiethoxysilane, di-t-butyldi-n-propoxylsilane, di-t-butyldi-i-propoxysilane, di-t-butyldi-n-butoxysilane, di-t-butyldi-s-butoxysilane, di-t-butyldi-i-butoxysilane, di-t-butyldi-t-butoxysilane, trimethylmethoxysilane, trimethylethoxysilane, trimethyl-n-propoxysilane, trimethyl-i-propoxysilane, trimethyl-n-butoxysilane, trimethyl-s-butoxysilane, trimethyl-i-butoxysilane, trimethyl-t-butoxysilane, triethylmethoxysilane, triethylethoxysilane, triethyl-n-propoxylsilane, triethyl-i-propoxysilane, triethyl-n-butoxysilane, triethyl-s-butoxysilane, triethyl-i-butoxysilane, triethyl-t-butoxysilane, tri-n-propylmethoxysilane, tri-n-propylethoxysilane, tri-n-propyl-n-propoxysilane, tri-n-propyl-i-propoxysilane, tri-n-propyl-n-butoxysilane, tri-n-propyl-s-butoxysilane, tri-n-propyl-i-butoxysilane, tri-n-propyl-t-butoxysilane, tri-i-propylmethoxysilane, tri-i-propylethoxysilane, tri-i-propyl-n-propoxysilane, tri-i-propyl-i-propoxysilane, tri-i-propyl-n-butoxysilane, tri-i-propyl-s-butoxysilane, tri-i-propyl-i-butoxysilane, tri-i-propyl-t-butoxysilane, tri-n-butylmethoxysilane, tri-n-butylethoxysilane, tri-n-butyl-n-propoxysilane, tri-n-butyl-i-propoxysilane, tri-n-butyl-n-butoxysilane, tri-n-butyl-s-butoxysilane, tri-n-butyl-i-butoxysilane, tri-n-butyl-t-butoxysilane, tri-i-butylmethoxysilane, tri-i-butylethoxysilane, tri-i-butyl-n-propoxysilane, tri-i-butyl-i-propoxysilane, tri-i-butyl-n-butoxysilane, tri-i-butyl-s-butoxysilane, tri-i-butyl-i-butoxysilane, tri-i-butyl-t-butoxysilane, tri-s-butylmethoxysilane, tri-s-butylethoxysilane, tri-s-butyl-n-propoxysilane, tri-s-butyl-i-propoxysilane, tri-s-butyl-n-butoxysilane, tri-s-butyl-s-butoxysilane, tri-s-butyl-i-butoxysilane, tri-s-butyl-t-butoxysilane, tri-t-butylmethoxysilane, tri-t-butylethoxysilane, tri-t-butyl-n-propoxysilane, tri-t-butyl-i-propoxysilane, tri-t-butyl-n-butoxysilane, tri-t-butyl-s-butoxysilane, tri-t-butyl-i-butoxysilane, and tri-t-butyl-t-butoxysilane.

According to the method of the invention, the silane compounds may be used either singly or in combination. Use of at least one of the compounds represented by the formula (4) and at least one of the compounds represented by the formula (5) in combination is especially preferred. A ratio of the compound of the formula (4) to the compound of the formula (5) is preferably from 5:95 to 95:5, more preferably from 25:75 to 75:25. A hydrolyzable silane compound other than the above-described silane compound may be added.

In the reaction, a silane compound other than the above-described trivalent or tetravalent hydrolyzable silane compounds having a single silicon atom may be added. Examples of such a silane compound include, but not limited to, divalent hydrolyzable silane compounds such as dimethyldimethoxysilane and dimethyldiethoxysilane and hydrolyzable silane compounds having plural silicon atoms such as hexamethoxydisiloxane, methylenebistrimethoxysilane, methylenebistriethoxysilane, 1,3-propylenebistrimethoxysilane, 1,4-(butylene)bistrimethoxysilane and 1,4-phenylenebistrimethoxysilane. It is to be noted that the amount of such a silane compound is preferably 30 mole % or less in terms of silicon.

Water for hydrolysis to be added to the reaction system is from 0.5 to 100 times the mole, more preferably from 1 to 10 times the mole of the moles necessary for completely hydrolyzing the silane compound.

When a polymer solution is prepared by hydrolyzing and condensing the hydrolyzable silane compound, it may contain, in addition to water, a solvent such as alcohol corresponding to the alkoxy group of the silane compound. Examples include methanol, ethanol, isopropyl alcohol, butanol, propylene glycol monomethyl ether, propylene glycol monopropyl ether, propylene glycol monopropyl ether acetate, ethyl lactate and cyclohexanone.

The amount of the solvent other than water is preferably from 0.1 to 500 times the mass, more preferably from 1 to 100 times the mass of the silane compound.

The hydrolysis and condensation reactions of the silane compound are performed under ordinarily employed conditions. The reaction temperature typically ranges from 0° C. to the boiling point of an alcohol generated by the hydrolysis and condensation reactions, preferably from room temperature to 80° C.

A more convenient reaction process for the formation and growth of a silica sol is dropwise addition of the hydrolyzable silane compound, directly or after dissolving it in the above-described solvent, to an aqueous solution of the hydrophobic basic catalyst and hydrophilic basic catalyst adjusted to the reaction temperature or sometimes in a reaction solution obtained by adding the above-described organic solvent to the aqueous solution. The dropwise addition is performed typically from 10 minutes to 24 hours, more preferably for from 30 minutes to about 8 hours. The time varies, depending on a reaction apparatus and scale of the reaction.

Since the reactions proceed speedily after completion of the dropwise addition, it is not necessary to have a long ripening time after completion of the dropwise addition. A long ripening time however does not cause any marked deterioration. A film obtained by ripening for 4 hours or longer after completion of the dropwise addition and then temporarily losing the neutralization reaction however tends to have decreased strength. The film tends to have higher strength when neutralization reaction is terminated within 1 hour after completion of the dropwise addition.

By the above-described reactions of the invention, a silica sol strong enough to provide a porous film having high strength and a low dielectric constant as will be described later can be obtained. The silica sol can be made more desirable by adding a step of temporarily losing the crosslinkability of a silanol after the hydrolysis and condensation reactions as disclosed in Japanese Patent Provisional Publication No. 2004-149714.

Described specifically, aggregation of silica particles in the reaction mixture is suppressed by the presence of the hydrophobic basic catalyst so that gelation hardly occurs in spite of a high-temperature reaction for long hours. Inactivation of the catalyst in the post-treatment step however facilitates association/condensation of silica particles, leading to considerable deterioration of storage stability. When the material having deteriorated stability is used for a film forming composition solution as is, it seems to lose the crosslinkability before film formation, though the reason for it is not clear, and the film thus obtained cannot have sufficient strength. It is therefore preferred to introduce a step of protecting a surface active silanol as soon as the completion of the condensation reaction by the basic catalyst. Described specifically, the active silanol is protected by adding a divalent or polyvalent carboxylic acid compound after the neutralization reaction of the basic catalyst but before the disappearance of the crosslinkability, more preferably immediately after the neutralization reaction or by carrying out the neutralization reaction itself with a divalent or polyvalent carboxylic acid, thereby carrying out neutralization and silanol protection simultaneously, whereby the crosslinkability can be lost until the decomposition of the carboxylic acid compound at the time of film formation.

Preferred examples of the carboxylic acid having, in the molecule thereof, at least two carboxyl groups include oxalic acid, malonic acid, malonic anhydride, maleic acid, maleic anhydride, fumaric acid, glutaric acid, glutaric anhydride, citraconic acid, citraconic anhydride, itaconic acid, itaconic anhydride and adipic acid. Such a carboxylic acid acts effectively when added in an amount ranging from 0.05 mole % to 10 mole %, preferably from 0.5 mole % to 5 mole % based on the silicon unit.

Preparation of a film forming composition using the silica sol of the invention is performed in accordance with a method for preparing a film forming composition containing a conventional silica sol.

When the film forming composition is used as a material for a semiconductor insulating film which will be described later and an alkali metal hydroxide is used as the hydrophilic basic catalyst, demetallization treatment must be performed at any stage during from above-described termination of the reaction to preparation of a coating composition solution. Many examples of demetallization treatment have already been proposed, but metals are typically removed by a method using an ion exchange resin or washing of the organic solvent solution with water. When a silica sol is prepared in the presence of a combination of only ammonium catalysts not containing metal impurities during reaction, such demetallization treatment is not necessary, but is usually added similarly.

A solvent such as water used for preparing the silica-sol-containing composition is typically exchanged with a coating solvent which will be described later. There are many known examples of it, but even if the silica sol of the invention is subjected to the above-described stabilizing treatment, an operation for isolating it by completely removing the solvent is not preferred.

A number of solvents to be used for preparing a solution of a film forming coating composition are known. Similar solvents are usable for the film forming composition of the invention. Specific examples include aliphatic hydrocarbon solvents such as n-pentane, isopentane, n-hexane, isohexane, n-heptane, 2,2,2-trimethylpentane, n-octane, isooctane, cyclohexane and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene and n-amylnaphthalene; ketone solvents such as acetone, methyl ethyl ketone, methyl n-propyl ketone, methyl n-butyl ketone, methyl isobutyl ketone, cyclohexanone, 2-hexanone, methylcyclohexanone, 2,4-pentanedione, acetonylacetone, diacetone alcohol, acetophenone, and fenthion; ether solvents such as ethyl ether, isopropyl ether, n-butyl ether, n-hexyl ether, 2-ethylhexyl ether, dioxolane, 4-methyldioxolane, dioxane, dimethyldioxane, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether and dipropylene glycol dibutyl ether, ester solvents such as diethyl carbonate, ethyl acetate, γ-butyrolactone, γ-valerolactone, n-propyl acetate, isopropyl acetate, n-butyl acetate, isobutyl acetate, sec-butyl acetate, n-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate and diethyl phthalate; nitrogen-containing solvents such as N-methylformamide, N,N-dimethylformamide, acetamide, N-methylacetamide, N,N-dimethylacetamide, N-methylpropionamide, and N-methylpyrrolidone, and sulfur-containing solvents such as dimethyl sulfide, diethyl sulfide, thiophene, tetrahydrothiophene, dimethyl sulfoxide, sulfolane, and 1,3-propanesultone.

These solvents may be used either singly or in combination.

By dilution, the composition is provided as a final product for obtaining a target film. The degree of dilution differs, depending on the viscosity or intended film thickness, but the composition is diluted while adjusting the amount of the solvent typically from 50 to 99 mass %, more preferably from 75 to 98 mass %.

As another material to be added to the film forming composition, a number of film forming aids including surfactants are known and basically, any of them can be added to the film forming composition of the invention. As the film forming aid, surfactants, silane coupling agents and radical generators described in, for example, Japanese Patent Provisional Publication No. 2001-354904 can be used.

A proportion of the film forming aid, if it is added, in the total solid content of the film forming composition of the invention is from 0.001 to 10 mass % in terms of a solid content.

As a silicon-based polymer component, a polysiloxane prepared by a method other than that described herein can be incorporated in the film forming composition of the invention, but a proportion of such a polysiloxane in the total solid content must be adjusted to 59 mass % or less, preferably 20 mass % or less in order to fulfill the advantage of the invention.

As the polysiloxane prepared by a method other than that described herein and miscible in the silica-sol-containing film forming composition of the invention, following ones are preferred additives because they are not only useful as a binder or film forming aid but also can improve the binding force between silica sols, thereby improving the mechanical strength of the film without impairing the dielectric constant which the film is expected to have.

Polysiloxane compounds having the above-described function and preferred as an additive contain a high concentration of silanol groups and are synthesized in the following manner.

A starting material is a mixture of a hydrolyzable silane compound containing at least one tetrafunctional alkoxysilane compound represented by the following formula (6):

$$Si(OR^6)_4 \quad (6)$$

(wherein, $R^6$s may be the same or different and each independently represents a linear or branched $C_{1-4}$ alkyl group) and/or at least one alkoxysilane compound represented by the following formula (7):

$$R^7{}_n Si(OR^8)_{4-n} \quad (7)$$

(wherein, $R^8$(s) may be the same or different when there are plural $R^8$s and each independently represents a linear or branched $C_{1-4}$ alkyl group, $R^7$(s) may be the same or different when there are plural $R^7$s and each independently represents a linear or branched $C_{1-4}$ alkyl group which may have a substituent, and n is an integer from 1 to 3).

A proportion of the compound of the formula (6) is, in terms of silicon atoms, preferably 25 mole % or greater but not greater than 100 mole % based on the total moles of the entire hydrolyzable silane compounds, that is, the compounds (6) and (7).

Preferred examples of $R^7$ of the silane compound (7) include alkyl groups such as methyl, ethyl, n-propyl, iso-propyl, n-butyl, iso-butyl, sec-butyl, t-butyl, n-pentyl 2-ethylbutyl, 3-ethylbutyl, 2,2-diethylpropyl, cyclopentyl, n-hexyl and cyclohexyl, alkenyl groups such as vinyl and allyl, alkynyl groups such as ethynyl, aryl groups such as phenyl and tolyl, aralkyl groups such as benzyl and phenethyl, and other unsubstituted monovalent hydrocarbon groups. They may each have a substituent such as fluorine. Of these, methyl, ethyl, n-propyl, iso-propyl, vinyl and phenyl groups are especially preferred.

As $R^6$ and $R^8$, those providing an alcohol, which appears as a by-product after hydrolysis, having a boiling point lower than that of water are preferred. Examples include methyl, ethyl, n-propyl and iso-propyl.

The polysiloxane compound can be obtained by hydrolyzing and condensing such a silane compound in the presence of an acid catalyst. In order to obtain a polysiloxane compound capable of heightening a binding force between silica sols, however, it is preferred to carry out hydrolysis and condensation reactions in the presence of an acid catalyst not in a conventional manner but under such conditions as to hydrate silanol generated during hydrolysis and thereby prevent gelation.

A method of obtaining a siloxane compound by hydrolysis and condensation reactions of a hydrolyzable silane compound in the presence of an acid catalyst is performed under reaction control. The reaction control is necessary because in the hydrolysis and condensation reactions of a hydrolyzable silane compound in the presence of an acid catalyst, a hydrolysis speed is higher than a condensation speed so that when a trivalent or tetravalent hydrolyzable silane compound is used as a raw material, the concentration of active silanol groups in the reaction mixture becomes too high without any reaction control and a large amount of an intermediate having many active reaction active sites is formed, which may cause gelation. For the reaction control to prevent gelation, either a method of controlling generation of silanol groups or a method of directly controlling gelation reaction of silanol groups generated by hydrolysis is used. These two controlling methods differ in an addition manner of the hydrolyzable silane compound and an amount of water added for hydrolysis.

Of these two methods, the method of controlling generation of silanol groups is more typical. In condensation in the presence of an acid catalyst under ordinary conditions, water is added dropwise to the reaction mixture containing a hydrolyzable silane compound. This makes it possible to provide a sufficient time for silanol groups generated by hydrolysis to be consumed for condensation, control a rise in the concentration of the silanol groups and thereby prevent gelation. In addition, gelation is prevented by using a larger amount of an organic solvent having a relatively low polarity while decreasing the total amount of water, thereby avoiding contact between water and the hydrolyzable silane compound as much as possible and condensing the silanol groups while storing the alkoxy groups without causing an abrupt increase in the concentration of the silanol groups. In the particular case where no organic solvent is used, an amount of water must be adjusted to 1 mole or less per mole of the hydrolyzable group in the hydrolyzable silane compound. Even in the typical case where an organic solvent is used, an amount of water is often adjusted similarly to 1 mole or less per mole of the hydrolyzable group in the hydrolyzable silane compound. Apart from actual use, an upper limit of the amount of water is at most three times or five times larger than the amount necessary for hydrolysis in a patent literature which has a large margin. When the amount of water exceeded 1 mole per 1 mole of a hydrolyzable group in the actual use as described above, there is a risk of gelation. When water is added in an amount of two times the amount necessary for hydrolysis of all hydrolyzable groups, a polysiloxane compound cannot be taken out from the reaction mixture due to gelation thereof. In addition, the polysiloxane compound is synthesized while suppressing an increase in the concentration of silanol groups so that its content is low. For example, preparation of a polysiloxane compound in an amount of 5 mole % or greater, in terms of entire silicon atoms, usually leads to gelation.

The method of directly controlling a gelation reaction is on the other hand characterized by the use of a large excess of water. Active silanol groups are hydrated with a large excess of water, whereby the gelation reaction is controlled. More preferably, hydrolysis is performed using a large excess of water instead of using a large amount of an organic solvent which disturbs hydration. In the ordinary reaction operation, the hydrolyzable silane compound is charged in a reaction mixture of hydrolysis which constantly contains water in an amount exceeding the molar equivalent of the hydrolyzable groups already charged. It is more common to charge a large excess of water and an acid catalyst in a reaction tank in advance and add the hydrolyzable silane compound dropwise thereto. Such a design enables prompt hydration of silanol groups generated by the hydrolysis. Although a large amount of silanol groups is generated in the reaction mixture, sufficient hydration always occurs due to existence of a large amount of water and as a result of control of the activity of the silanol groups by hydration, gelation is prevented. Moreover, a polysiloxane compound available by this method is known to have, in the molecule thereof, a high content of silanol groups.

In the above-described method, an amount of water used for hydrolysis of the monomer must be, at the same time, sufficient for hydrating the silanol groups generated in the reaction system. It is preferred to add the water in an amount of 3 moles or greater, preferably 5 moles or greater, per mole of the hydrolyzable group contained in the monomer. Gelation can usually be prevented by the addition of water in an amount greater than 5 moles. Described specifically, assuming that the lower limit of the preferred amount of water is 5 moles as described above and the upper limit is 100 moles as described later, each per mole of the hydrolyzable group contained in the monomer, when a polysiloxane compound is prepared from the tetravalent hydrolyzable silane compound of the formula (6) and the trivalent compound, among the compounds represented by the formula (7), the following relationship holds:

$$100 \times (4 \times Q + 3 \times T) \geq X \geq 5 \times (4 \times Q + 3 \times T)$$

(wherein Q represents the mole of the compound of the formula (6), T represents the mole of the compound of the formula (7), and X represents the mole of water). By carrying out hydrolysis and condensation reactions in the presence of an acid catalyst while using such a large amount of water, a polysiloxane compound having a high silanol content is available without causing gelation. Addition of water in an amount exceeding 100 moles may be uneconomical because it only enlarges an apparatus used for reactions, though depending on the amount, and raises a cost for drainage treatment.

As the acid catalyst, any known ones are basically usable by properly adjusting the reaction conditions. Use of a catalyst selected from organic sulfonic acids which are said to be strongly acidic among organic acids, and inorganic acids which are said to be more strongly acidic is preferred to allow hydrolysis and condensation reactions to proceed completely. Examples of the inorganic acids include hydrochloric acid, sulfuric acid, nitric acid, and perchloric acid, while those of the organic sulfonic acids include methanesulfonic acid, tosic acid and trifluoromethanesulfonic acid. The amount of the strong acid used as the catalyst is from $10^{-6}$ moles to 1 mole, preferably $10^{-5}$ to 0.5 mole, more preferably $10^{-4}$ to 0.3 mole per mole of the silicon-containing monomer.

A divalent organic acid may be added further in order to heighten the stability of the polysiloxane derivative during the reaction. Examples of such an organic acid include oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, and citraconic acid. Of these, oxalic acid an maleic acid are especially preferred. An amount of the organic acid other than the organic sulfonic acid is from $10^{-6}$ moles to 10 moles, preferably $10^{-5}$ to 5 moles, more preferably $10^{-4}$ to 1 mole per mole of the silicon-containing monomer.

The hydrolysis and condensation reactions are started by dissolving the catalyst in water and then adding the monomer to the resulting solution. At this time, an organic solvent may be added to the aqueous solution of the catalyst or the monomer may be diluted in advance with the organic solvent. The reaction temperature is from 0 to 100° C., preferably from 10 to 80° C. It is also preferred to keep the temperature in the range from 10 to 50° C. during dropwise addition of the monomer and then ripen the reaction mixture in the range from 20 to 80° C.

Preferred examples of the organic solvent include methanol, ethanol, 1-propanol, 2-propanol, 1-butanol, 2-butanol, 2-methyl-i-propanol, acetone, acetonitrile, tetrahydrofuran, toluene, hexane, ethyl acetate, cyclohexanone, methyl-2-n-amylketone, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone, and mixtures thereof.

Of these solvents, water soluble ones are preferred. Examples include alcohols such as methanol, ethanol, 1-propanol and 2-propanol, polyols such as ethylene glycol and propylene glycol, polyol condensate derivatives such as propylene glycol monomethyl ether, ethylene glycol monomethyl ether, propylene glycol monoethyl ether, ethylene glycol monoethyl ether, propylene glycol monopropyl ether, and ethylene glycol monopropyl ether, acetone, acetonitrile and tetrahydrofuran.

The organic solvent added in an amount of 50 mass % or greater hinders progress of hydrolysis and condensation reactions so that the amount must be less than 50 mass %. Per mole of the monomer, preferably from 0 to 1,000 ml of the organic solvent is added. Use of a large amount of the organic solvent is uneconomical because it requires an unnecessarily large reactor. The amount of the organic solvent is preferably 10 mass % or less based on water. It is most preferred to perform the reactions without the organic solvent.

The hydrolysis and condensation reactions are, if necessary, followed by the neutralization reaction of the catalyst. In order to smoothly conduct the following extraction operation further, the alcohol generated during the hydrolysis and condensation reactions is preferably removed under reduced pressure to obtain an aqueous solution of the reaction mixture. The amount of an alkaline substance necessary for the neutralization is preferably from 1 to 2 equivalents of the inorganic acid or organic sulfonic acid. As the alkaline substance, any substance is usable insofar as it is alkaline in water. Heating temperature of the reaction mixture varies, depending on the kind of the alcohol to be removed, but preferably from 0 to 100° C., more preferably from 10 to 90° C., still more preferably from 15 to 80° C. The degree of vacuum varies, depending on the kind of the alcohol to be removed, exhaust apparatus, condensing apparatus or heating temperature, but is preferably not greater than atmospheric pressure, more preferably an absolute pressure of 80 kPa or less, still more preferably an absolute pressure of 50 kPa or less. It is difficult to know the precise amount of the alcohol to be removed, but about at least 80 mass % of the alcohol generated during the reactions is preferably removed.

In order to remove the catalyst used for the hydrolysis and condensation reactions from the aqueous solution, the polysiloxane derivative is extracted with an organic solvent. As the organic solvent, those capable of dissolving therein the polysiloxane derivative and separating a mixture with water into two layers are preferred. Examples include methanol, ethanol, 1-propanol, 2-propanol, 1-butanol, 2-butanol, 2-methyl-i-propanol, acetone, tetrahydrofuran, toluene, hexane, ethyl acetate, cyclohexanone, methyl-2-n-amylketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone and cyclopentyl methyl ether, and mixtures thereof.

Mixtures of a water soluble organic solvent and a sparingly water-soluble organic solvent are especially preferred. Preferred examples of the combination include, but not limited to, methanol+ethyl acetate, ethanol+ethyl acetate, 1-propanol+ethyl acetate, 2-propanol+ethyl acetate, propylene glycol monomethyl ether+ethyl acetate, ethylene glycol monomethyl ether+ethyl acetate, propylene glycol monoethyl ether+ethyl acetate, ethylene glycol monoethyl ether+ethyl acetate, propylene glycol monopropyl ether+ethyl acetate, ethylene glycol monopropyl ether+ethyl acetate, methanol+methyl isobutyl ketone, ethanol+methyl isobutyl ketone, 1-propanol+methyl isobutyl ketone, 2-propanol+methyl isobutyl ketone, propylene glycol monomethyl ether+ methyl isobutyl ketone, ethylene glycol monomethyl ether+ methyl isobutyl ketone, propylene glycol monoethyl ether+ methyl isobutyl ketone, ethylene glycol monoethyl ether+ methyl isobutyl ketone, propylene glycol monopropyl ether+ methyl isobutyl ketone, ethylene glycol monopropyl ether+ methyl isobutyl ketone, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate, ethanol+propylene glycol methyl ether acetate, 1-propanol+propylene glycol methyl ether acetate, 2-propanol+propylene glycol methyl ether acetate, propylene glycol monomethyl ether+propylene glycol methyl ether acetate, ethylene glycol monomethyl ether+propylene glycol methyl ether acetate, propylene glycol monoethyl ether+propylene glycol methyl ether acetate, ethylene glycol monoethyl ether+propylene glycol methyl ether acetate, propylene glycol monopropyl ether+propylene glycol methyl ether acetate, and ethylene glycol monopropyl ether+propylene glycol methyl ether acetate.

The mixing ratio of the water soluble organic solvent and the sparingly water-soluble organic solvent is determined as needed, but the water soluble organic solvent is added in an amount of from 0.1 to 1000 parts by mass, preferably from 1 to 500 parts by mass, more preferably from 2 to 100 parts by mass, based on 100 parts by mass of the sparingly water-soluble organic solvent.

The organic layer obtained after the removal of the catalyst used for the hydrolysis and condensation reactions is mixed in a porous-film forming composition after partial distillation of the solvent under reduced pressure and solvent substitution by re-dilution.

An undesirable impurity which is thought to be a microgel is sometimes mixed in the reaction mixture due to fluctuations in the conditions during hydrolysis reaction or concentration. The microgel can be removed by washing with water prior to mixing of the polysiloxane compound. When washing with water is not so effective for the removal of the microgel, this problem may be overcome by washing the polysiloxane compound with acidic water and then with water.

The acidic water usable for the above purpose contains preferably a divalent organic acid, more specifically, oxalic acid or maleic acid. The concentration of the acid contained in the acidic water is from 100 ppm to 25 mass %, preferably from 200 ppm to 15 mass %, more preferably from 500 ppm to 5 mass %. The amount of the acidic water is from 0.01 to 100 L, preferably from 0.05 to 50 L, more preferably from 0.1 to 5 L per L of the polysiloxane compound solution obtained in the above-described step. The organic layer may be washed in a conventional manner. Both of them are charged in the same container, stirred, and left to stand to separate a water layer from the mixture. The washing may be performed at least once. Washing ten times or more does not bring about reasonable effects so that the washing is performed preferably from once to about five times.

The acid used for washing is then removed by washing with neutral water. It is only necessary to use, for this washing, water called deionized water or ultrapure water. The neutral water is used in an amount of from 0.01 to 100 L, preferably from 0.05 to 50 L, more preferably from 0.1 to 5 L per L of the polysiloxane compound solution washed with the acidic water. The washing is performed in the above-described manner, more specifically, by charging them in the same container, stirring the resulting mixture and leaving it to stand to separate a water layer from the mixture. The washing may be performed at least once. Washing ten times or more does not bring about reasonable effects so that the washing is performed preferably from once to about five times.

To the polysiloxane compound solution which has finished washing, a solvent for preparing a coating composition, which will be described later, is added. By performing a solvent exchange under reduced pressure, a mother solution to be added to the porous-film forming composition can be obtained. This solvent exchange may be carried out after addition of silicon oxide fine particles which will be described later. The solvent exchange is conducted at a temperature which varies, depending on the kind of the extraction solvent to be removed, but is preferably from 0 to 100° C., more preferably from 10 to 90° C., still more preferably from 15 to 80° C. The degree of vacuum varies depending on the kind of the extraction solvent to be removed, exhaust gas apparatus, condensing apparatus or heating temperature, but is preferably not greater than the atmospheric pressure, more preferably an absolute pressure of 80 kPa or less, still more preferably an absolute pressure of 50 kPa or less.

When the solvent is exchanged, nanogel may be generated due to loss of stability of the polysiloxane compound. The generation of the nanogel depends on the affinity between the final solvent and polysiloxane compound. An organic acid may be added to prevent the generation of it. As the organic acid, divalent ones such as oxalic acid and maleic acid, and monovalent carboxylic acids such as formic acid, acetic acid and propionic acid are preferred. The amount of the organic acid is from 0 to 25 mass %, preferably from 0 to 15 mass %, more preferably from 0 to 5 mass % based on the polymer in the solution before the solvent exchange. When the organic acid is added, its amount is preferably 0.5 mass % or greater. If necessary, the acid may be added to the solution before the solvent exchange and then, solvent extracting operation may be performed.

As described above, the polysiloxane compound obtained in the above-described method can have, in the molecule thereof a greater amount of silanol groups compared with that obtained by the conventional method using hydrolysis and condensation reactions. Described specifically, when the polysiloxane compound is composed of units represented by the following formulas:

[Chemical formula 1]

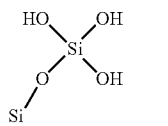  Q1

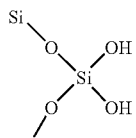  Q2

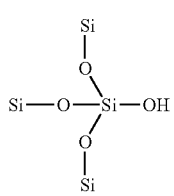  Q3

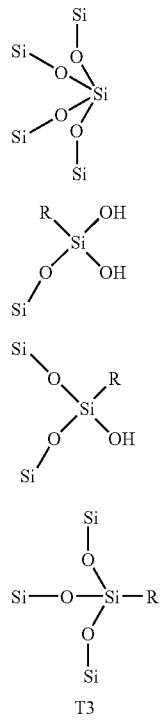

(wherein, Q means a unit derived from a tetravalent hydrolyzable silane, T means a unit derived from a trivalent hydrolyzable silane, and R in T1 to T3 indicates that a bond represented by Si—R is a bond between silicon and a carbon substituent), component ratios (molar ratios) (q1 to q4, t1 to t3) of the units (Q1 to Q4, T1 to T3) in the polysiloxane compound as measured by $^{29}$Si—NMR satisfies the following relationships:

$(q1+q2+t1)/(q1+q2+q3+q4+t1+t2+t3) \leq 0.2$ and $(q3+t2)/(q1+q2+q3+q4+t1+t2+t3) \geq 0.4$.

The polysiloxane compound which can satisfy the above-described relationships may improve the binding force between the above-described silica sols.

If the condensation rate of the polysiloxane compound is calculated on the basis of a remaining amount of silanol groups or alkoxy groups (both groups are generically referred to as "hydrolyzable group"), a polysiloxane compound having a silanol content of 5 mole % or greater in terms of silicon atoms is obtained by the above-described method. Use of such a polysiloxane compound can improve the binding force between silica sols.

If the polysiloxane compound obtained in the above-described method is added, a film-forming composition is obtained by mixing a solution of this polysiloxane compound in a coating solvent with the above-described solution containing the silica sol of the invention while adjusting the viscosity and the like as described above.

After preparation of a porous-film forming composition in the above-described manner, the composition is spin coated onto a target substrate at an adequate rotation speed while controlling the solute concentration of the composition, whereby a thin film having a desired thickness can be formed.

A thin film having a thickness of about 0.1 to 1.0 μm is typically formed in practice, but the film thickness is not limited thereto. A thin film with a greater thickness can be formed by carrying out coating of the composition plural times.

Not only spin coating but also another application method such as scan coating can be employed.

A thin film thus formed can be converted into a porous film in a known manner. Described specifically, the porous film is available as a final product by removing the solvent from the thin film by using an oven in a drying step (typically called pre-baking step in a semiconductor fabrication process) to heat it to preferably from 50 to 150° C. for several minutes and then sintering it in the range from 350 to 450° C. for from about 5 minutes to 2 hours. A curing step with ultraviolet radiation or electron beam may be added further.

The porous film thus obtained has excellent mechanical strength because the film as a whole is composed mainly of silica gel particles having high mechanical strength. It has hardness, as measured by nanoindentation, of 0.5 to 2 GPa and a modulus of elasticity from about 4 to 15 GPa. This is remarkably high mechanical strength considering that a conventional porous material, which is obtained by adding a thermally decomposable polymer to a silicone resin and then removing the polymer by heating to form pores, has only hardness from 0.05 to 1 GPa and modulus of elasticity from 1.0 to 4.0 GPa. The porous film of the invention has higher strength even if their dielectric constants are of the same level than a porous film obtained in the conventional manner, for example, by using a silica sol prepared from tetrapropylammonium hydroxide alone.

The mechanism of the porous film of the invention having both high strength and low dielectric constant is considered as below. A space between particles in the film becomes a pore as the solvent evaporates during application, film formation and sintering steps, whereby a film having a low dielectric constant can be obtained. When the silica particles have low strength, they undergo deformation or shrinkage during the formation of pores, which reduces the size of the pores. If the silica particles have high strength as in the invention, on the other hand, the pores do not shrink in size and the porous film of the invention can have higher strength when compared with a film equal in dielectric constant. As shown later in Examples, neither a zeolite-like repeating structure in the atomic arrangement nor micropores are observed in the porous film of the invention. The film of the invention may be therefore utterly different in concept from the conventional film having improved strength. The above-described observation may support the presumption of the inventors.

A low-dielectric-constant porous film to be used for semiconductor devices has conventionally a problem of deterioration in the mechanical strength of the film because introduction of pores into the film to reduce its dielectric constant and make the film porous decreases the density of the material constituting the film. The deterioration in the mechanical strength not only has an influence on the strength of semiconductor devices themselves but also causes peeling due to lack of sufficient strength against chemical mechanical polishing typically employed for the semiconductor fabrication process.

The porous film obtained using the composition for forming a porous film composed mainly of a silica gel and prepared by the method of the invention can have both a low dielectric constant and high mechanical strength simultaneously. In particular, when the porous film is used as an interlayer insulating film of semiconductor devices, it does not cause such peeling and enables fabrication of highly-reliable, high-speed and small-sized semiconductor devices because it has high mechanical strength in spite of a porous film and also has low dielectric constant.

A semiconductor device having, as an interlayer insulating film thereof, the porous film is also one of the inventions. The term "interlayer insulating film" as used herein may mean a film for electrically insulating conductive sites present in a layer or conductive sites present in different layers. Examples of the conductive sites include metal interconnects.

One embodiment of the semiconductor device of the invention will next be described based on FIG. 1.

As substrate 1, Si semiconductor substrates such as Si substrate and SOI (Si On Insulator) substrate can be employed. Alternatively, it may be a compound semiconductor substrate such as SiGe or GaAs.

Interlayer insulating films illustrated in FIG. 1 are interlayer insulating film 2 of a contact layer, interlayer insulating films 3, 5, 7, 9, 11, 13, 15, and 17 of interconnect layers, and interlayer insulating films 4, 6, 8, 10, 12, 14, and 16 of a via layer.

The interconnect layers from the interlayer insulating film 3 of the bottom interconnect layer to the interlayer insulating film 17 of the uppermost interconnect layer are referred to as M1, M2, M3, M4, M5, M6, M7 and M8, respectively in the order from the bottom to the top. The layers from the interlayer insulating film 4 of the lowermost via layer to the interlayer insulating film 16 of the uppermost via layer are referred to as V1, V2, V3, V4, V5, V6 and V7, respectively in the order from the bottom to the top.

Some metal interconnects are indicated by numerals 18 and 21 to 24, respectively, but even if such a numeral is omitted, portions with the same pattern as that of these metal interconnects illustrate metal interconnects.

A via plug 19 is made of a metal and it is typically copper in the case of a copper interconnect. Even if a numeral is omitted, portions with the same pattern as that of these via plugs illustrate via plugs.

A contact plug 20 is connected to a gate of a transistor (not illustrated) formed on the uppermost surface of the substrate 1 or to the substrate.

As illustrated, the interconnect layers and the via layers are stacked alternately. The term "multilevel interconnects" typically means M1 and layers thereabove. The interconnect layers M1 to M3 are typically called local interconnects; the interconnect layers M4 to M5 are typically called intermediate or semi-global interconnects; and the interconnect layers M6 to M8 are typically called global interconnects.

In the semiconductor device illustrated in FIG. 1, the porous film of the invention is used as at least one of the interlayer insulating films 3, 5, 7, 9, 11, 13, 15, and 17 of the interconnect layers and the interlayer insulating films 4, 6, 8, 10, 12, 14 and 16 of the via layers.

For example, when the porous film of the invention is used as the interlayer insulating film 3 of the interconnect layer (M1), a capacitance between the metal interconnect 21 and metal interconnect 22 can be reduced greatly. When the porous film of the invention is used as the interlayer insulating film 4 of the via layer (V1), a capacitance between the metal interconnect 23 and metal interconnect 24 can be reduced greatly. Thus, use of the porous film of the invention having a low dielectric constant for the interconnect layer enables drastic reduction of the capacitance between metal connects in the same layer. In addition, use of the porous film of the invention having a low dielectric constant for the via layer enables drastic reduction in the capacitance between the metal interconnects above and below the via layer. Accordingly, use of the porous film of the invention for all the interconnect layers and via layers enables great reduction in the parasitic capacitance of interconnects.

In addition, use of the porous film of the invention as an insulating film for interconnection is free from a conventional problem, that is, an increase in a dielectric constant caused by moisture absorption of porous films during formation of multilevel interconnects by stacking them one after another. As a result, the semiconductor device featuring high speed operation and low power consumption can be obtained.

In addition, due to high strength of the porous film of the invention, the semiconductor device thus obtained has improved mechanical strength. As a result, the semiconductor device thus obtained has greatly improved production yield and reliability.

The present invention will hereinafter be described in detail by Examples. It should be noted that the scope of the invention is not limited to or by these Examples.

Example 1

A mixture of 21.7 g of methyltrimethoxysilane and 24.3 g of tetramethoxysilane was slowly added dropwise under stirring to a solution of 11.5 g of a 20% aqueous solution of tetrapropylammonium hydroxide, 6.2 g of a 25% aqueous solution of tetramethylammonium hydroxide, 81 g of ultrapure water and 180 g of ethanol which solution had been heated to 70° C. in advance. Immediately after completion of the dropwise addition, the reaction mixture was neutralized with 23 g of a 20% aqueous solution of oxalic acid. Propylene glycol monomethyl ether (200 ml) was added and the mixture was concentrated under reduced pressure to remove ethanol. Ethyl acetate (300 ml) was then added and washing with 200 ml of ultrapure water was repeated until the mixture became pH 7. Propylene glycol monomethyl ether (200 ml) was added again and the mixture was concentrated under reduced pressure until its nonvolatile residue became 7% or less. Propylene glycol monomethyl ether was added again to adjust the nonvolatile residue content to about 7 mass %, whereby a porous-film forming composition was obtained. Three porous-film forming compositions (Examples 1-(1) to (3)) were prepared in a similar manner except that only the reaction time was changed ((1) one hour, (2) four hours, and (3) eight hours, respectively).

Example 2

A mixture of 21.7 g of methyltrimethoxysilane and 24.3 g of tetramethoxysilane was slowly added dropwise under stirring to a solution of 21.5 g of a 20% aqueous solution of tetrapropylammonium hydroxide, 8.2 g of a 25% aqueous solution of tetramethylammonium hydroxide, 81 g of ultrapure water and 180 g of ethanol which solution had been heated to 80° C. in advance. Immediately after completion of the dropwise addition, the reaction mixture was neutralized with 23 g of a 20% aqueous solution of oxalic acid. Propylene glycol monomethyl ether (200 ml) was added and the mixture was concentrated under reduced pressure to remove ethanol. Ethyl acetate (300 ml) was then added and washing with 200 ml of ultrapure water was repeated until the mixture became pH 7. Propylene glycol monomethyl ether (200 ml) was added again and the mixture was concentrated under reduced pressure until its nonvolatile residue became 7% or less. Propylene glycol monomethyl ether was added again to adjust the nonvolatile residue to about 7 mass %, whereby a porous-film forming composition was obtained. Three porous-film forming compositions (Examples 2-(1) to (3)) were prepared in a similar manner except that only the reaction time was changed (to (1) one hour, (2) four hours, and (3) eight hours, respectively).

Example 3

A mixture of 21.7 g of methyltrimethoxysilane and 24.3 g of tetramethoxysilane was slowly added dropwise under stirring to a solution of 11.5 g of a 25% aqueous solution of tetrabutylammonium hydroxide, 6.2 g of a 25% aqueous solution of tetramethylammonium hydroxide, 81 g of ultrapure water and 180 g of ethanol which solution had been heated to 70° C. in advance. Immediately after completion of the dropwise addition, the reaction mixture was neutralized with 23 g of a 20% aqueous solution of oxalic acid. Propylene glycol monomethyl ether (200 ml) was added and the mixture was concentrated under reduced pressure to remove ethanol. Ethyl acetate (300 ml) was then added and washing with 200 ml of ultrapure water was repeated until the mixture became pH 7. Propylene glycol monomethyl ether (200 ml) was added again and the mixture was concentrated under reduced pressure until its nonvolatile residue became 7% or less. Propylene glycol monomethyl ether was added again to adjust the nonvolatile residue to about 7 mass %, whereby a porous-film forming composition was obtained. Three porous-film forming compositions (Examples 3-(1) to (3)) were prepared in a similar manner except that only the reaction time was changed ((1) one hour, (2) four hours, and (3) eight hours, respectively).

Comparative Examples 1-(1) to (3)

A mixture of 21.7 g of methyltrimethoxysilane and 24.3 g of tetramethoxysilane was slowly added dropwise under stirring to a solution of 8.2 g of a 25% aqueous solution of tetramethylammonium hydroxide, 81 g of ultrapure water and 180 g of ethanol, which solution had been heated to 60° C. in advance. Immediately after completion of the dropwise addition, the reaction mixture was neutralized with 23 g of a 20% aqueous solution of oxalic acid. Propylene glycol monopropyl ether (200 ml) was added and the mixture was concentrated under reduced pressure to remove ethanol. Ethyl acetate (300 ml) was then added and washing with 200 ml of ultrapure water was repeated until the mixture became pH 7. Propylene glycol monopropyl ether (200 ml) was added again and the mixture was concentrated under reduced pressure until its nonvolatile residue became 7% or less. Propylene glycol monopropyl ether was added again to adjust the nonvolatile residue to about 7 mass %, whereby a comparative composition was obtained. Three comparative compositions were prepared in a similar manner except that only the reaction time was changed ((1) one hour, (2) four hours, and (3) eight hours, respectively).

Comparative Examples 2-(1) and (2)

A mixture of 21.7 g of methyltrimethoxysilane and 24.3 g of tetramethoxysilane was slowly added dropwise under stirring to a solution of 34.5 g of a 20% aqueous solution of tetrapropylammonium hydroxide, 81 g of ultrapure water and 180 g of ethanol, which solution had been heated to 80° C. in advance. Immediately after completion of the dropwise addition, the reaction mixture was neutralized with 23 g of a 20% aqueous solution of oxalic acid. Propylene glycol monopropyl ether (200 ml) was added and the mixture was concentrated under reduced pressure to remove ethanol. Ethyl acetate (300 ml) was then added and washing with 200 ml of ultrapure water was repeated until the mixture became pH 7. Propylene glycol monopropyl ether (200 ml) was added again and the mixture was concentrated under reduced pressure until its nonvolatile residue became 7% or less. Propylene glycol monopropyl ether was added again to adjust the nonvolatile residue to about 7 mass %, whereby a comparative composition was obtained. Two comparative compositions were prepared in a similar manner except that only the reaction time was changed ((1) four hours and (2) eight hours, respectively).

Comparative Example 3

After 23.0 g of a 15% aqueous solution of tetrapropylammonium hydroxide was mixed with 27.0 g of tetraethoxysilane and the mixture was stirred at room temperature for 3 days, the reaction mixture was stirred under heating at 80° C. for 35 hours to yield a zeolite-crystal-containing solution having a particle size peak at 550 nm. A mixture of 6.2 g of tetraethoxysilane and 28.4 g of methyltriethoxysilane was slowly added dropwise under stirring to a solution which had been obtained by adding 4.1 g of a 25% aqueous solution of tetramethylammonium hydroxide, 62.6 g of ultrapure water and 180 g of ethanol to the resulting zeolite-crystal-containing solution and had been heated to 80° C. in advance. Immediately after completion of the dropwise addition, the reaction mixture was neutralized with 23 g of a 20% aqueous solution of oxalic acid. Propylene glycol monopropyl ether (200 ml) was added and the mixture was concentrated under reduced pressure to remove ethanol. Ethyl acetate (300 ml) was then added and washing with 200 ml of ultrapure water was repeated until the mixture became pH 7. Propylene glycol monopropyl ether (200 ml) was added again and the mixture was concentrated under reduced pressure until the nonvolatile residue content became 7% or less. Propylene glycol monopropyl ether was added again to adjust the nonvolatile residue to about 7 mass %, whereby a comparative composition was obtained.

Example 4

Porous films were formed using the porous-film forming compositions obtained in Examples 1 to 3 (nine compositions in total) and the comparative compositions obtained in Comparative Examples 1 to 3 (six compositions in total) in accordance with the following process and their physical properties were evaluated (Examples 4-(1) to (3), Examples 5-(1) to (3), Examples 6-(1) to (3), Comparative Examples 4-(1) to (3) Comparative Examples 5-(1) and (2), Comparative Example 6).

The physical properties of each of the porous films were measured by the following methods.
1. Dielectric constant (k) was measured using "495-CV System" (product of SSM Japan) in accordance with C-V measurements with an automatic mercury probe.
2. Mechanical strength (modulus of elasticity) was measured using a nano indenter (product of Nano Instruments).

Each of the porous-film forming compositions was spin-coated onto an 8-inch silicon wafer at 4,000 rpm for 1 minute by a spin coater. A thin film thus obtained was heated at 120° C. for 2 minutes by using a hot plate. After heating further for 3 minutes at 250° C., it was heated at 450° C. for one hour in a clean oven in a nitrogen atmosphere, whereby a porous film was obtained. The films thus obtained using the above-described compositions each has a thickness of about 3,000 Å.

The dielectric constant and modulus of elasticity of the porous films thus formed are shown in Table 1. The relationship between the dielectric constant and mechanical strength of these films is shown in the graph of FIG. 2.

Figure 2:
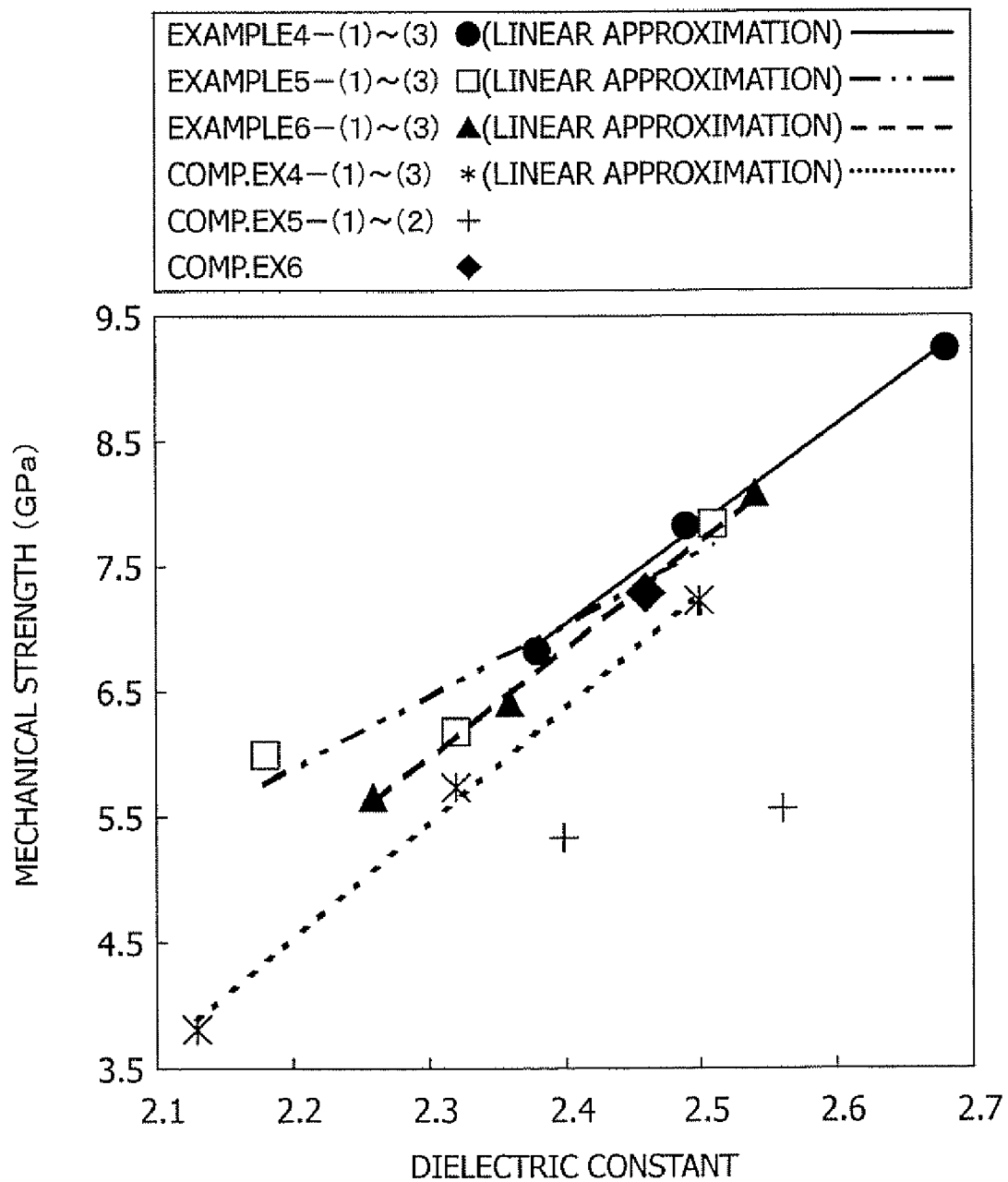
FIG. 2 is a graph showing mechanical strength as a function of dielectric constant.

It is to be noted that the approximate line in FIG. 2 is determined by the least-squares method.

TABLE 1

| | Coating composition | Dielectric constant k | Mechanical strength (GPa) |
|---|---|---|---|
| Example 4-(1) | Composition of Ex. 1-(1) | 2.68 | 9.24 |
| Example 4-(2) | Composition of Ex. 1-(2) | 2.49 | 7.82 |
| Example 4-(3) | Composition of Ex. 1-(3) | 2.38 | 6.82 |
| Example 5-(1) | Composition of Ex. 2-(1) | 2.51 | 7.84 |
| Example 5-(2) | Composition of Ex. 2-(2) | 2.32 | 6.17 |
| Example 5-(3) | Composition of Ex. 2-(3) | 2.18 | 5.99 |
| Example 6-(1) | Composition of Ex. 3-(1) | 2.54 | 8.08 |
| Example 6-(2) | Composition of Ex. 3-(2) | 2.36 | 6.4 |
| Example 6-(3) | Composition of Ex. 3-(3) | 2.26 | 5.65 |
| Comp. Ex. 4-(1) | Composition of Comp. Ex. 1-(1) | 2.5 | 7.23 |
| Comp. Ex. 4-(2) | Composition of Comp. Ex. 1-(2) | 2.32 | 5.73 |
| Comp. Ex. 4-(3) | Composition of Comp. Ex. 1-(3) | 2.13 | 3.81 |
| Comp. Ex. 5-(1) | Composition of Comp. Ex. 2-(1) | 2.56 | 5.56 |
| Comp. Ex. 5-(2) | Composition of Comp. Ex. 2-(2) | 2.4 | 5.33 |
| Comp. Ex. 6 | Composition of Comp. Ex. 3 | 2.54 | 7.71 |

(Reference Test 1)

Figure 3:
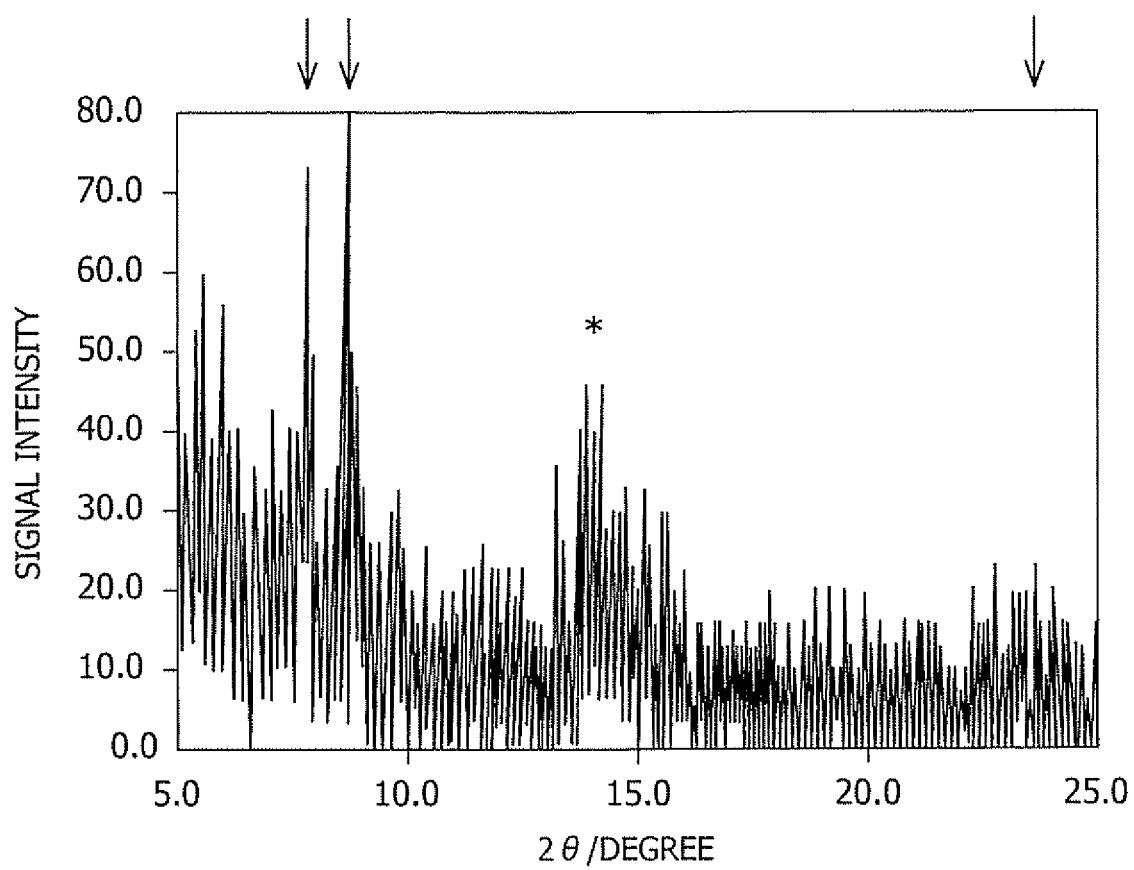
FIG. 3 is an X-ray diffraction chart of a film obtained using a film forming composition of Comparative Example 3.

The compositions of Example 2-(3) and Comparative Example 3 were each applied onto a silicon wafer and then baked to form a porous film having a thickness of 3000 Å. As a result of X-ray diffraction of the film, a signal based on the presence of zeolite was observed (FIG. 3) from the porous film obtained using the composition of Comparative Example 3, while no signal was observed from the porous film obtained using the composition of Example 2. The position of a standard peak of zeolite is shown by an arrow in FIG. 3 and this suggests that the film in this chart contains zeolite. The signal with the symbol * in FIG. 3 has remained because signals derived from a silicon wafer of a substrate cannot be cancelled from the background. Nothing but noise was observed from the film obtained from the composition of Example 2-(3).

(Reference Test 2)

The micropores of the films obtained in Reference Test 1 were measured. Nitrogen adsorption technique using Quantachrome's Autosorb 1 was employed for the measurement. As a result, distribution of pores was observed in a micropore region of 1 nm or less only in Comparative Example 6, but the distribution of pores was observed in a mesopore region of 2 nm or greater in the other sample.

When a low-dielectric-constant insulating film is designed, it is necessary, as a method of reducing only its dielectric constant, to heighten the porosity by controlling the size of particles contained in a film forming composition to raise a void ratio or using a pore-forming agent such as porogen. The film however has no mechanical strength at the porous portion thereof. When films are made of the same material, there is a trade-off relationship between a porosity and mechanical strength. As actual examples in FIG. 2 show, there is typically a linear relationship, within a narrow range, that is, a range of a dielectric constant from 2.1 to 2.7, between a low dielectric constant and mechanical strength of films available from materials synthesized using the same material and catalyst. In order to verify whether a low-dielectric-constant insulating film with high mechanical strength is formed or not, the mechanical strength relative to the dielectric constant must be compared between these films.

As is apparent from FIG. 2, the low-dielectric-constant insulating films of the invention obtained in Examples each has high mechanical strength at each dielectric constant compared with the mechanical strength/dielectric constant of a film formed in a conventional manner, for example, the low-dielectric-constant insulating film which is obtained in Comparative Example 4 using a silica sol synthesized by the conventional method and showing relatively high mechanical strength at each dielectric constant. This tendency is marked at a dielectric constant of 2.5 or less.

Moreover, from Reference Tests 1 and 2, it has been elucidated that the film obtained using the silica sol of the invention has neither a zeolite-like crystal structure nor zeolite-like micropores in the film. As the above-described results of mechanical strength/dielectric constant have revealed, when the films obtained in Examples are compared with the film obtained using the composition of Comparative Example 3 containing zeolite fine particles derived from crystals and having considerably high strength, the low-dielectric-constant insulating films obtained in Examples have mechanical strength comparable to that of the low-dielectric-constant insulating film having zeolite particles incorporated therein. In short, it has been found that although the silica sol of the invention is available without a cumbersome operation necessary for preparation of zeolite fine particles, it provides equal mechanical strength.

The method for preparing a porous-film forming composition according to the invention is effective for preparing a material for forming a low-dielectric-constant insulating film with high mechanical strength.

The porous-film forming composition according to the invention is effective as a material for forming a low-dielectric-constant insulating film with high mechanical strength.

The method for forming a porous film according to the invention is effective for preparing a material for forming a low-dielectric-constant insulating film with high mechanical strength.

The porous film according to the invention is effective as a material for forming a low-dielectric-constant insulating film with high mechanical strength.

The semiconductor device according to the invention is effective as a high-performance semiconductor device capable of achieving high speed and low power consumption operation.

It is to be understood that the present invention is not limited to the embodiments given above. The embodiments given above are merely illustrative, and those having substantially the same configuration as the technical concept defined by the appended claims of the present invention and having similar functions and effects are considered to fall within the technical scope of the present invention.

The invention claimed is:

1. A method for preparing a silica sol, which comprises hydrolyzing and condensing a hydrolyzable silane compound in the presence of at least one hydrophilic basic catalyst selected from alkali metal hydroxides and quaternary ammonium hydroxides represented by the following formula (1):

$$(R^1)_4 N^+ OH^- \tag{1}$$

wherein, $R^1$s may be the same or different and each independently represents a hydrocarbon group which may contain an oxygen atom and the cationic portion $[(R^1)_4 N^+]$ satisfies the following relationship (2):

$$(N+O)/(N+O+C) \geq 1/5 \tag{2}$$

in which, N, O and C are the numbers of nitrogen, oxygen and carbon atoms contained in the cationic portion, respectively, and at least one hydrophobic basic catalyst selected from quaternary ammonium hydroxides which do not satisfy the above-described relationship (2).

2. A method for preparing a silica sol according to claim 1, wherein the hydrophilic basic catalyst is selected from lithium hydroxide, sodium hydroxide, potassium hydroxide, cesium hydroxide, tetramethylammonium hydroxide and choline.

3. A method for preparing a silica sol according to claim 1, wherein the hydrophobic basic catalyst is selected from quaternary organic ammonium hydroxides represented by the following formula (3):

$$(R^2)_4 N^+ OH^- \tag{3}$$

wherein, $R^2$s may be the same or different and each independently represents a linear or branched $C_{1-8}$ alkyl group with the proviso that all the $R^2$s do not simultaneously represent a methyl group.

4. A method for preparing a silica sol according to claim 1, wherein the hydrolyzable silane compound contains at least one silane compound selected from those represented by the following formulas (4) and (5):

$$Si(OR^3)_4 \tag{4}$$

$$R^4_n Si(OR^5)_{4-n} \tag{5}$$

wherein, $R^3$s may be the same or different and each independently represents a linear or branched $C_{1-4}$ alkyl group, $R^4$(s) may be the same or different when there are plural $R^4$s and each independently represents a linear or branched $C_{1-4}$ alkyl group which may have a substituent, $R^5$(s) may be the same or different when there are plural $R^5$s and each independently represents a linear or branched $C_{1-4}$ alkyl group, and n is an integer from 1 to 3.

5. A method for preparing a silica sol according to claim 1, which further comprises, after the hydrolyzing and condensing step, a step of temporarily losing the crosslinkability on the surface of the silica sol.

6. A method for preparing a silica sol according to claim 5, wherein the step of temporarily losing the crosslinkability includes an addition of a carboxylic acid having at least two carboxyl groups in the molecule thereof.

* * * * *